United States Patent
Lee et al.

(10) Patent No.: US 7,887,225 B2
(45) Date of Patent: Feb. 15, 2011

(54) DIRECT-TYPE BACKLIGHT UNIT HAVING SURFACE LIGHT SOURCE

(75) Inventors: Won Joon Lee, Seoul (KR); In Tae Yeo, Seoul (KR); Hun Joo Hahm, Gyunggi-do (KR); Young Sam Park, Seoul (KR); Kyung Taeg Han, Gyunggi-do (KR); Ho Sik Ahn, Incheon (KR); Chang Ho Song, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 67 days.

(21) Appl. No.: 11/822,331

(22) Filed: Jul. 5, 2007

(65) Prior Publication Data

US 2008/0007939 A1 Jan. 10, 2008

(30) Foreign Application Priority Data

Jul. 10, 2006 (KR) ...................... 10-2006-0064543

(51) Int. Cl.
*F21V 8/00* (2006.01)
(52) U.S. Cl. .................. 362/561; 362/555; 362/558
(58) Field of Classification Search ................. 362/561, 362/558, 555, 511, 545
See application file for complete search history.

(56) References Cited

U.S. PATENT DOCUMENTS

| | | | |
|---|---|---|---|
| 6,188,527 B1 | 2/2001 | Bohn | |
| 6,404,131 B1 * | 6/2002 | Kawano et al. | 315/82 |
| 6,562,643 B2 | 5/2003 | Chen | |
| 6,576,930 B2 * | 6/2003 | Reeh et al. | 257/98 |
| 7,061,454 B2 * | 6/2006 | Sasuga et al. | 345/82 |
| 7,316,496 B2 * | 1/2008 | Wu et al. | 362/561 |
| 2005/0139846 A1 * | 6/2005 | Park et al. | 257/98 |

FOREIGN PATENT DOCUMENTS

| | | |
|---|---|---|
| JP | 61-144890 | 7/1986 |
| JP | 2001-203396 | 7/2001 |
| JP | 2003-318449 | 11/2003 |
| JP | 2005-223222 | 8/2005 |
| KR | 10-2002-0035819 | 5/2002 |

OTHER PUBLICATIONS

Japanese Office Action issued in Japanese Patent Application No. JP 2007-177181 dated Aug. 4, 2009.
Chinese Office Action, w/ English translation thereof, issued in Chinese Patent Application No. CN 200710130512X dated on Oct. 10, 2008.

* cited by examiner

*Primary Examiner*—Sharon E Payne
(74) *Attorney, Agent, or Firm*—McDermott Will & Emery LLP (57) ABSTRACT

In a direct-type backlight unit, a board has upper and lower surfaces defining a thickness therebetween. A plurality of unit light sources are disposed on the board. Here, in each of the unit light sources, a wiring pattern is formed on the board. A light emitting device is disposed on the wiring pattern to electrically connect thereto. A non-conductive side wall surrounds, without interruption, the light emitting device at a predetermined interval therefrom, the non-conductive side wall having a height lower than that of the light emitting device. Also, an encapsulant is formed in a dome shape inside the side wall. In this fashion, the light emitting devices are mounted on the board by a chip-on-board technique.

15 Claims, 9 Drawing Sheets

PRIOR ART

DIRECT-TYPE BACKLIGHT UNIT HAVING SURFACE LIGHT SOURCE

CLAIM OF PRIORITY

This application claims the benefit of Korean Patent Application No. 2006-64543 filed on Jul. 10, 2006 in the Korean Intellectual Property Office, the disclosure of which is incorporated herein by reference.

BACKGROUND OF THE INVENTION

1. Field of the Invention

The present invention relates to a surface light source of a direct-type backlight unit, and more particularly, to a direct-type backlight unit in which a unit surface light source composed of a light emitting device is mounted on a board by a chip-on-board technique, thereby manufacturing the backlight unit easily in a simpler process.

2. Description of the Related Art

With development in the electronic device industry, a liquid crystal display (LCD) is highlighted as a next-generation display device. The LCD does not generate light on its own, thus typically requiring a backlight unit for backlighting an LCD panel.

This backlight unit includes an edge-type and direct-type backlight unit. In the former, light generated from a light source is emitted sideward and then directed upward through a reflective plate or a diffusing pattern to be irradiated onto the liquid crystal panel. In contrast, in the latter, the light source is disposed below the liquid crystal panel to emit light sideward. Then the light is directed upward through a reflective sheet to be irradiated onto the liquid crystal panel.

Figure 1:
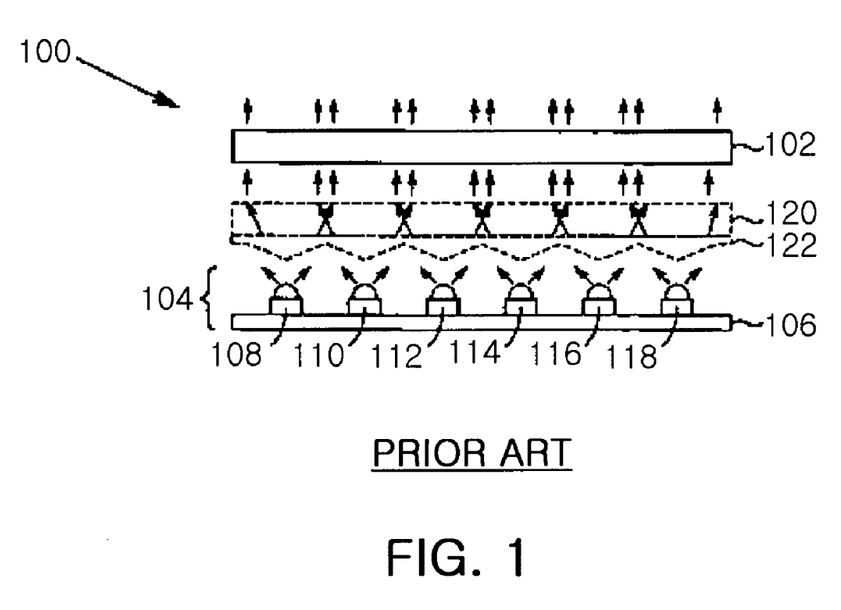
FIG. 1 is a schematic view illustrating an example of a conventional direct-type backlight unit.

FIG. 1 is a schematic view illustrating an example of a conventional direct-type backlight unit.

Referring to FIG. 1, a liquid crystal display 100 includes a direct-type backlight unit 104, a planar surface optical device 120, and a display device 102. The backlight unit 104 includes a board 106 and a plurality of LEDs 108 to 118 disposed thereon.

Light generated from the LEDs 108 to 118 is diffused through a diffusing plate 122 disposed below the planar optical device 120 while propagating through the planar optical device 120. Then the light backlights the display device 102.

The conventional backlight unit 104 has the LEDs 108 to 118 individually disposed on the board 106 to form a surface light source. This entails a time-consuming process and higher manufacturing costs.

SUMMARY OF THE INVENTION

The present invention has been made to solve the

The present invention has been made to solve the foregoing problems of the prior art and therefore an aspect of the present invention is to provide a direct-type backlight unit in which a unit surface light source composed of light emitting devices is disposed on a board by a chip-on-board technique, thereby manufacturing the backlight unit easily in a simpler process.

According to an aspect of the invention, the direct-type backlight unit includes a board having upper and lower surfaces defining a thickness therebetween; and a plurality of unit light sources mounted on the board, wherein each of the unit light sources includes a wiring pattern formed on the board; a light emitting device disposed on the wiring pattern to electrically connect thereto; a non-conductive side wall surrounding, without interruption, the light emitting device at a predetermined interval therefrom, the non-conductive side wall having a height lower than that of the light emitting device; and an encapsulant formed in a dome shape inside the side wall.

In the direct-type backlight unit of the invention, the wiring pattern in each of the unit light sources includes upper terminals formed on the upper surface of the board where the light emitting device is disposed to be electrically connected to the light emitting device; and lower terminals formed on the lower surface of the board; and internal connectors extending through the board to connect the upper and lower terminals together.

In the direct-type backlight unit of the invention, the light emitting device is electrically connected to the wiring pattern by wire bonding. Alternatively, the light emitting device is electrically connected to the wiring pattern by flip chip bonding.

In the direct-type backlight unit of the invention, each of the light sources includes an opaque layer or a light diffusing layer formed on an upper end portion of the encapsulant.

The side wall includes a plurality of coating layers. The non-conductive material adopts white solder paste or silver solder cream.

The side wall has a width that is 1.5% to 3% of a diameter of the encapsulant.

Also, the side wall has a height that is 1% to 1.5% of a diameter of the encapsulant.

In the direct-type backlight unit, the side wall has an outer wall surface inclined toward an inner wall surface in such a way that the side wall has a width decreasing toward an apex.

The encapsulant has a height that is 25% to 35% of a diameter thereof. Preferably, the encapsulant has a height that is ⅓ of a diameter thereof.

Each of the unit light sources may include at least two of the light emitting devices mounted inside the side wall.

The encapsulant is made of a transparent resin or a phosphor-mixed transparent resin.

Alternatively, some of the encapsulants in the light sources are made of a transparent resin and the other encapsulants are made of a phosphor-mixed transparent resin, wherein the encapsulants made of the transparent resin and the encapsulants made of the phosphor-mixed transparent resin are mixed together.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2:
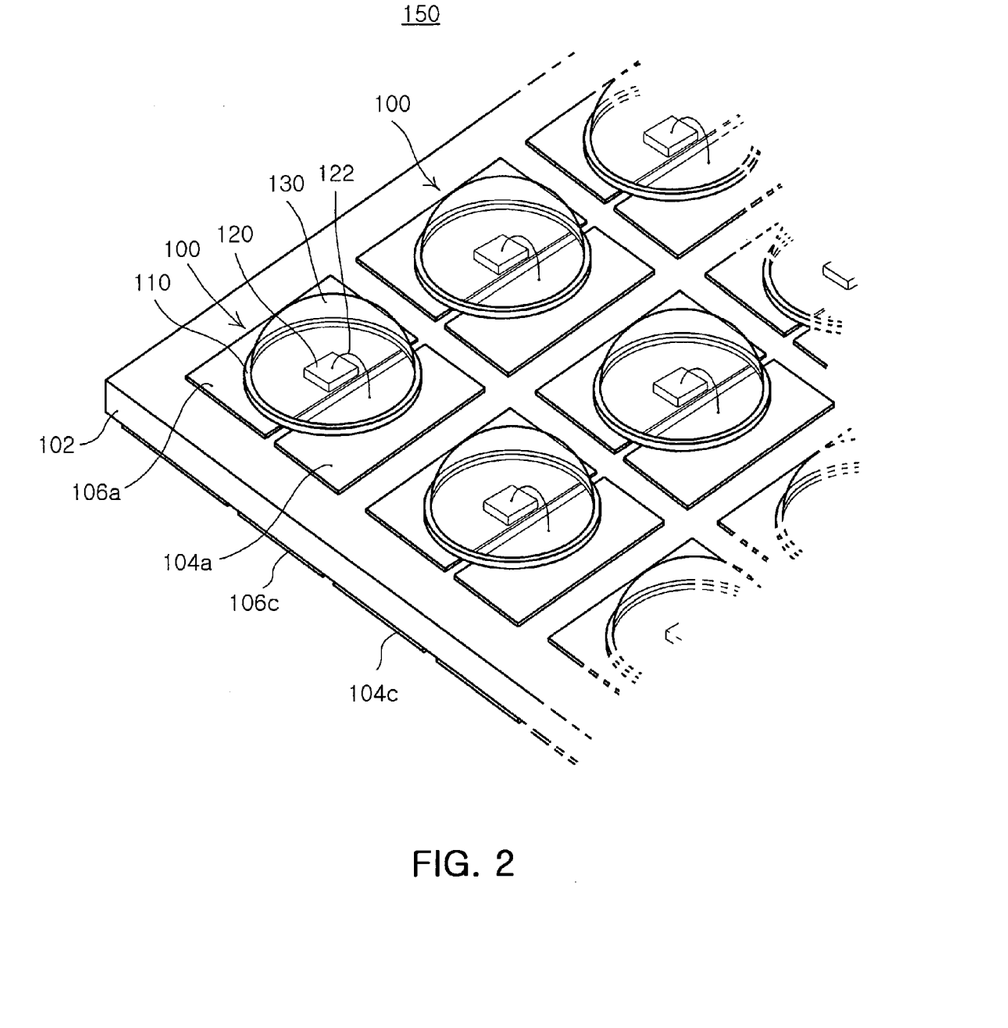
FIG. 2 is a perspective view illustrating a direct-type backlight unit according to the invention.
Figure 3:
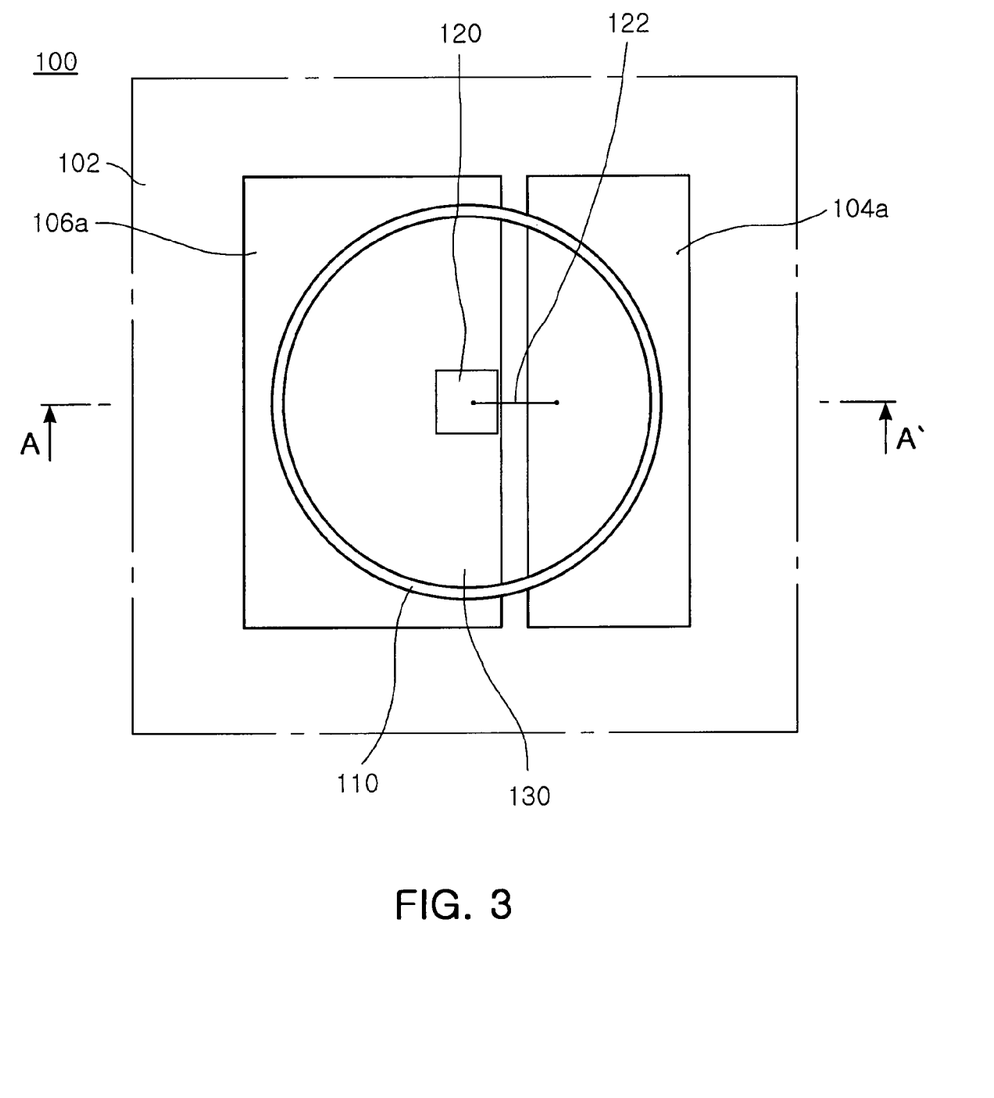
FIG. 3 is a plan view illustrating a unit surface light source of a direct-type backlight unit according to the invention.
Figure 4:
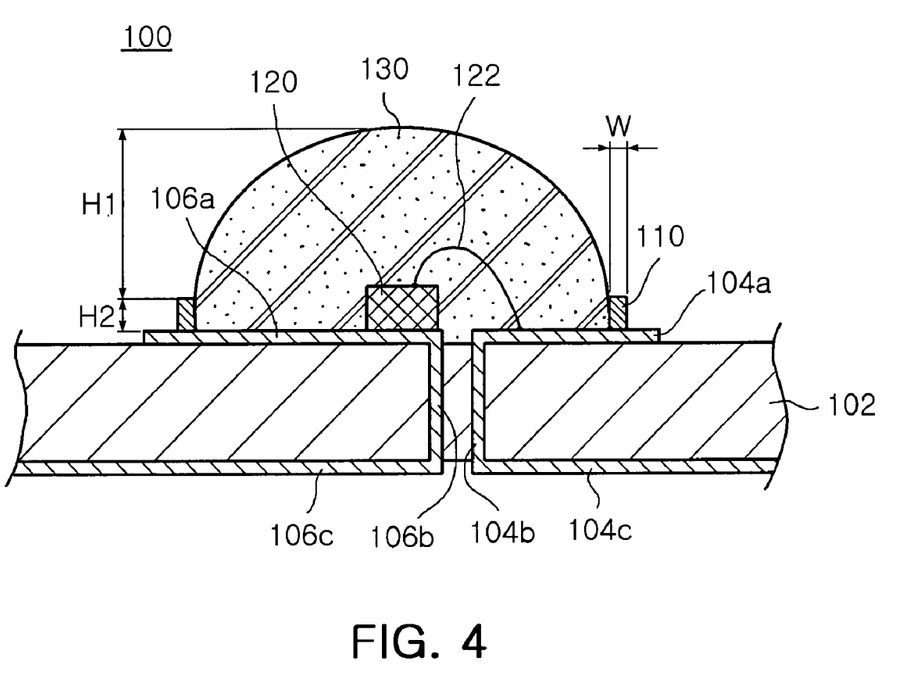
FIG. 4 is a cross-sectional view cut along the line A-A' of FIG. 3.

FIG. 2 is a perspective view illustrating a direct-type backlight unit according to the invention. FIG. 3 is a plan view illustrating a unit surface light of a direct-type backlight unit according to the invention. FIG. 4 is a cross-sectional view illustrating the surface light source cut along the line A-A' of FIG. 3.

As shown in FIG. 2, the direct-type backlight unit 150 includes a board 102 having upper and lower surfaces defining a thickness therebetween and a plurality of unit surface light sources 100 formed thereon.

Each of the unit surface light sources 100, as depicted from FIGS. 3 and 4, includes first and second upper terminals 104a and 106a configured as a wiring pattern on the upper surface of the board 102, and first and second lower terminals 104c and 106c configured as a wiring pattern on the lower surface of the board 102. The first upper and lower terminals 104a and 104c are connected to each other by a first internal connector 104b, and the second upper and lower terminals 106a and 106c are connected to each other by a second internal connector 106b. The first and second internal connectors 104 and 106b preferably extend through the board 102.

A light emitting device 120 is disposed on the second upper terminal 106a to electrically connect to the first and second upper terminals 104a and 106b. The light emitting device 120 is preferably a light emitting diode (LED) and connected to the first upper terminal 104a by a wire 122. The light emitting device 120 is also connected to the second upper terminal 160a by a wire (not illustrated) but alternatively by a solder ball.

To electrically connect the light emitting device 120 with an external power, the first and second upper terminals 104a and 106a, the first and second lower terminals 104c and 106c, and the first and second internal connectors 104b and 106b are formed. But alternatively, the internal connectors and the lower terminals may be omitted and only the first and second upper terminals 104a and 106a can be electrically connected to the light emitting device 120. Here, the first upper terminal 104a is electrically connected to the other adjacent one of the pair of upper terminals, i.e., the second upper terminal 106a.

Meanwhile, a side wall 110 is formed to surround, without interruption, the light emitting device 120. The side wall 110 is preferably shaped as a ring having a predetermined width W and height H2. Here, the side wall 110 abuts the first and second upper terminals 104a and 106a, and thus made of a non-conductive material to prevent short therebetween. Preferably, the non-conductive material adopts an insulating paint such as white solder paste or silver solder cream.

An encapuslant 130 is formed in a dome or an upper hemispheric shape inside the side wall 110. The encapsulant 130 encapsulates the light emitting device 120 and the wire 122 to protect them from external environment. The encapsulant 130 is preferably made of a high transparent resin, and more preferably, a transparent silicone which remains elastic, free from yellowing.

The encapsulant 130 is formed of a resin dispensed by a dispenser (not illustrated). The resin dispensed inside the side wall 110 from a nozzle of the dispenser is blocked by the side wall 110 without spreading out, and then bulged upward at a predetermined height H1 in a dome or upper hemispherical shape. In this fashion, the encapsulant 130 is formed in a desired shape by dispensing the resin, thereby easily producing a unit surface light source 100 by a chip-on-board technique and accordingly manufacturing a backlight unit 150 easily in a simple process.

That is, this eliminates a conventional cumbersome process of fabricating light emitting diode packages individually and then mounting them on a board, respectively.

A greater height H1 of the encapsulant 130 increases light extraction efficiency but narrows a view angle. On the contrary, a smaller height H1 of the encapsulant 130 widens a view angle but decreases light extraction efficiency. Therefore, preferably, the encapsulant 130 is formed in a hemispherical shape having a height that is 25% to 35% of a diameter thereof to ensure a view angle and light extraction efficiency satisfactorily. More preferably, the encapsulant 130 is formed in a dome shape having a height that is ⅓ of a diameter thereof.

A greater height of the side wall 110 can increase a height of the encapsulant 130. For example, in a case where the side wall 110 is shaped as a ring having a height of 30 μm to 40 μm and an inner diameter of 5 mm, the encapsulant 130 has a diameter of 5 mm and a height of 1.2 mm to 1.3 mm that is about ¼ of the diameter thereof when the transparent resin is dispensed inside the side wall 110. In contrast, in a case where the side wall 110 is shaped as a ring having a height of 50 μm to 70 μm and an inner diameter of 5 mm, the encapsulant 130 has a diameter of 5 mm and a height of 1.6 mm to 1.7 mm that is about ⅓ of the diameter thereof. Here, if a phosphor is mixed in the transparent resin, the encapsulant 130 is increased in its height by about 10%.

The encapsulant 130 having a height that is ⅓ of a diameter thereof as described above ensures a view angle and light extraction efficiency to be achieved satisfactorily. Thus, preferably, the side wall 110 has a height that is 1% to 1.5% of a diameter thereof.

Also, the side wall 110 having too great a width W increases manufacturing costs therefore. On the other hand, the side wall 110 having too small a width W may cause the resin dispensed inside the side wall 110 to flow over the side wall 110. Moreover, the side wall 110 having a width smaller than a height poses difficulties to a manufacturing process thereof. Therefore, preferably, the side wall 110 has a width W that is 1.5 to 3% of a diameter thereof.

In the conventional direct-type backlight unit, a reflective plate is widened in its width in a downward direction, thus providing a small mounting area for the light emitting device. This renders it difficult to mount a plurality of light emitting devices inside a side wall. Meanwhile, according to the invention, the side wall 110 is very low in its height, thereby maximizing a mounting area for the light emitting device. This allows each of the unit surface light sources to include at least two light emitting devices 120 inside the side wall 110. As described above, the side wall 110 having at least two light emitting devices mounted thereinside assures higher brightness.

Furthermore, to form the encapsulant 130 inside the side wall 110, the transparent resin alone may be dispensed, or alternatively, the transparent resin may contain a phosphor with a specific color coordinate mixed therein. That is, the direct-type backlight unit according to the invention may optionally adopt the transparent resin encapuslant 130 or the phosphor-mixed transparent resin encapsulant 130. Alternatively, in the backlight unit of the invention, some of the encapsulants in the unit surface light source may be made of the transparent resin and the other encapsulants may be made of the phosphor-mixed transparent resin. That is, the encapsulants made of the transparent resin and the encapsulants made of the phosphor-mixed transparent resin may be mixed together. Here, the transparent resin encapsulants 130 and the phosphor-mixed transparent encapsulants 130 can be arranged variously according to use and characteristics of the backlight unit.

Figure 5:
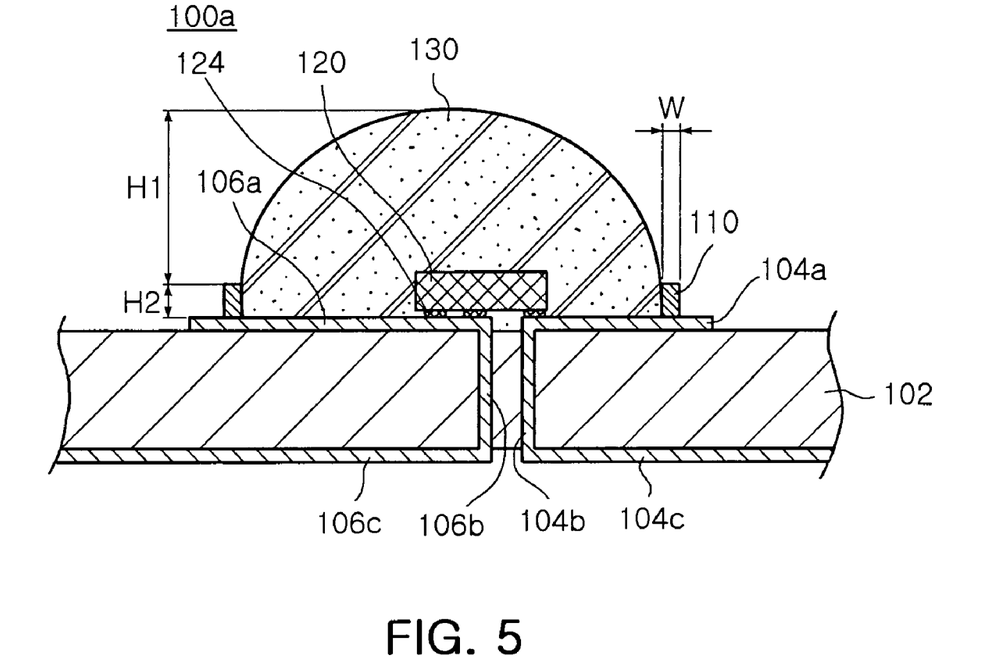
FIG. 5 is a cross-sectional view illustrating a unit surface light source according to another embodiment of the invention, corresponding to FIG. 4.

FIG. 5 is a cross-sectional view illustrating a unit surface light source 100a according to another embodiment of the invention, corresponding to FIG. 4. The unit surface light source 100a according to the embodiment of the invention is substantially identical to the unit surface light source 100 as described above except that a light emitting device 120 is flip-chip bonded. In FIG. 5, the light emitting device 120 is electrically connected to first and second upper terminals 104a and 106a by a plurality of solder balls 124.

Figure 6:
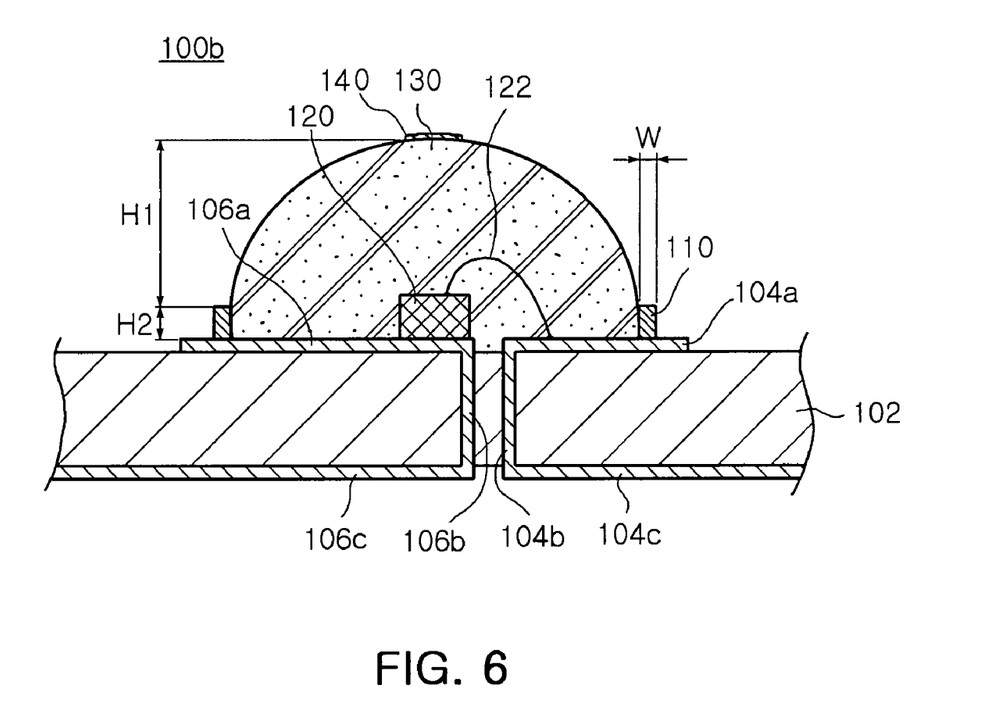
FIG. 6 is a cross-sectional view illustrating a unit surface light source according to further embodiment of the invention, corresponding to FIG. 4.

FIG. 6 is a cross-sectional view illustrating a unit surface light source 100b according to further another embodiment of the invention, corresponding to FIG. 4. The unit surface light source 100b according to this embodiment of the invention is substantially identical to the unit surface light source 100 as described above except that the unit surface light source 100b includes an opaque layer 140 formed on an upper end portion of the encapsulant.

In this embodiment of the invention, the opaque layer 140 blocks light generated from the light emitting device 120 to travel toward a just upward direction, thereby preventing a noticeably bright light spot from being formed on a liquid crystal panel 180 disposed above the opaque layer 140. Here, the opaque layer 140 includes a layer made of a semi-transparent material or a reflective material. Also, the opaque layer 140, even though replaced with a light diffusing layer, yields substantially the same effects.

As described above, to form the opaque layer 140, an opaque material is thinly applied or an opaque film is attached on the upper end portion of the encapuslant 130.

Figure 7:
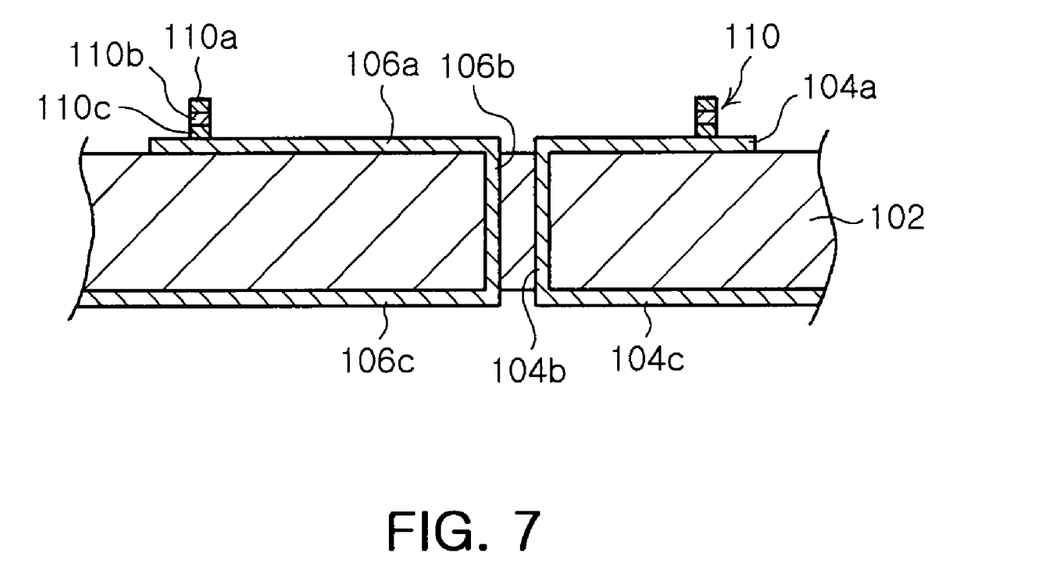
FIG. 7 is a detailed view illustrating a side wall of FIG. 4.

Now the sidewall 110 will be explained in greater detail with reference to FIG. 7. The side wall 110 is constructed of upper, middle and lower layers 110a, 110b and 110c having an identical width. These three layers 110a, 110b and 110c are applied or printed individually. For example, firstly, the lower layer 110c is applied or printed, and then cured. Then, the middle layer 110 is applied or printed, and then cured. Lastly, the upper layer 110b is applied or printed, and then cured. The number of these layers 110a, 110b and 110c can be varied but decided by height of the side wall as described above. That is, a maximum height of one of the layers is derived from a material type of the side wall and height thereof. Therefore, the number of the layers is decided by the desired height of the side wall 110. In view of the height of the side wall 110, the desired number of the layers is 3 to 5.

Figure 8:
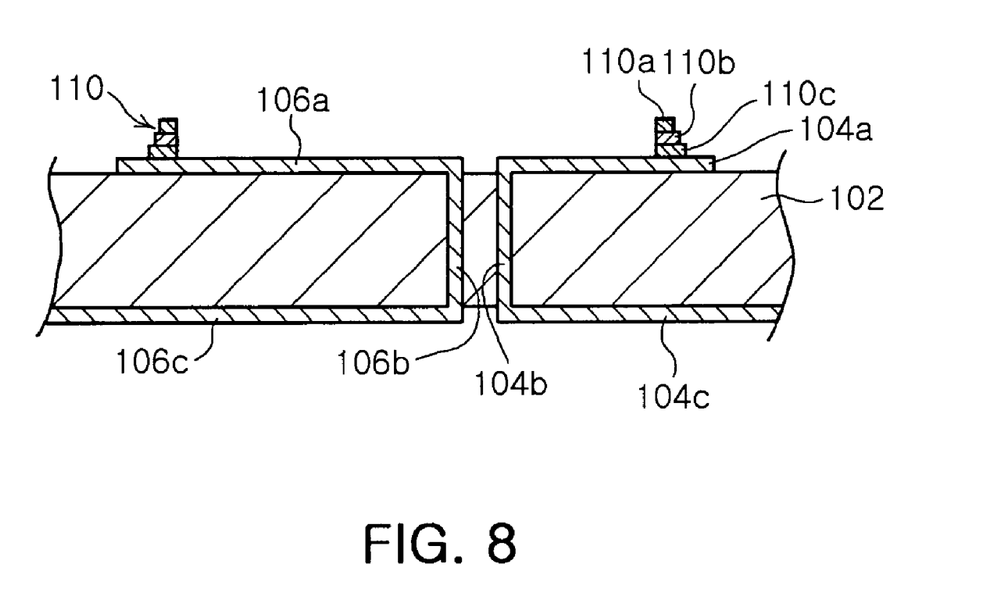
FIG. 8 is a cross-sectional view illustrating a side wall according to a modified embodiment of the invention.

FIG. 8 illustrates a side wall 110 according to a modified embodiment of the invention. The side wall 110 is constructed of a plurality of coating layers. To form the side wall 110, white solder paste or silver solder cream are coated several times. With the coating repeated, as shown in FIG. 8, a lower layer 110c has a greatest width and an upper layer 110a has a lowest width. As just described above, the side wall 110 having a width narrowing toward an apex, can be stably formed on the first and second upper terminals 104a and 106a. Here, if the side wall 110 has an inner wall surface inclined, the encapsulant 130 may flow over the side wall 110. Accordingly, preferably, the side wall 110 has the inner wall surface perpendicular to the first and second upper terminals 104a and 106a and an outer wall surface inclined toward the inner wall surface.

Figure 9:
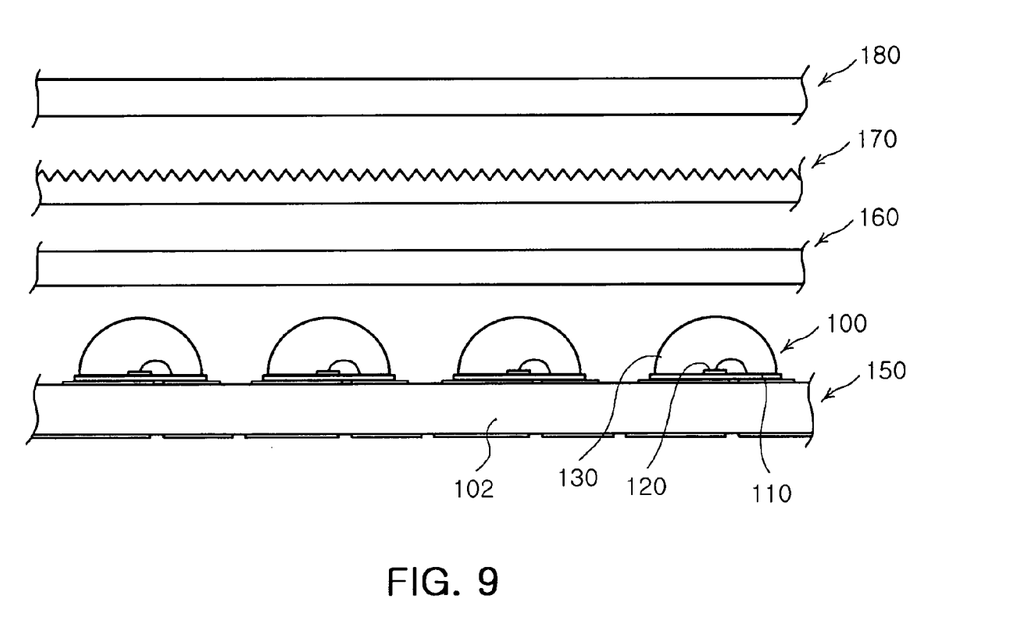
FIG. 9 is a schematic view illustrating a liquid crystal display including a direct-type backlight unit according to the invention.

FIG. 9 is a schematic view illustrating a liquid crystal display including a direct-type backlight unit according to the invention.

As shown in FIG. 9, the backlight unit 150 of the invention is used for a liquid crystal display including a diffusing plate 160, a prism sheet 170 and a liquid crystal panel 180. With this configuration, light generated from each of unit surface light sources 100 of the backlight unit 150 backlights the liquid crystal panel 180 through the diffusing plate 160 and the prism sheet 170.

As set forth above, according to exemplary embodiments of the invention, a unit surface light source composed of light emitting devices is mounted on a board by a chip-on-board technique, thereby manufacturing a backlight unit easily in a simple process and accordingly saving manufacturing costs therefore.

While the present invention has been shown and described in connection with the preferred embodiments, it will be apparent to those skilled in the art that modifications and variations can be made without departing from the spirit and scope of the invention as defined by the appended claims.

What is claimed is:

1. A direct-type backlight unit comprising:
   a board having upper and lower surfaces defining a thickness therebetween; and
   a plurality of unit light sources mounted on the board, wherein each of the unit light sources comprises:
      a wiring pattern formed on the board; and
      a light emitting device disposed on the wiring pattern to electrically connect thereto;
   a non-conductive side wall surrounding, without interruption, the light emitting device at a predetermined interval therefrom, the non-conductive side wall having a height lower than that of the light emitting device;
   an encapsulant formed in a dome shape inside the side wall, the encapsulant comprising a transparent resin or a phosphor-mixed transparent resin; and
   an opaque layer or a light diffusing layer formed on an upper end portion of the encapsulant, bounded by an area corresponding to the light emitting device, located in a vertical upward direction of the light emitting device and blocks light generated from the light emitting device from traveling in an upward direction to prevent a bright light spot from forming,
   wherein the non-conductive side wall has a ring shaped structure with a through hole formed inside thereof and blocks a resin dispensed inside the non-conductive side wall from spreading out to form the dome shaped encapsulant.

2. A direct-type backlight unit comprising:
   a board having upper and lower surfaces defining a thickness therebetween; and
   a plurality of unit light sources mounted on the board, wherein each of the unit light sources comprises;
      a wiring pattern formed on the board; and
      a light emitting device disposed on the wiring pattern to electrically connect thereto;
   a non-conductive side wall surrounding, without interruption, the light emitting device on the hoard at a predetermined interval therefrom, the non-conductive side wall having a height lower than that of the light emitting device;
   an encapsulant formed in a dome shape inside the side wall, the encapsulant comprising a transparent resin or a phosphor-mixed transparent resin; and
   an opaque layer formed on an upper end portion of the encapsulant located in a vertical upward direction of the light emitting device and blocks light generated from the light emitting device from travelling in an upward direction to prevent a bright light spot from forming, wherein the non-conductive side wall comprises a plurality of coating layers having an identical width, and wherein the non-conductive side wall has a ring shaped structure with a through hole formed inside thereof and blocks a resin dispensed inside the non-conductive side wall from spreading out to form the dome shaped encapsulant.

3. The direct-type backlight unit according to claim 2, wherein the opaque layer is bounded by an area corresponding to the light emitting device.

4. A direct-type backlight unit comprising:

a board having upper and lower surfaces defining a thickness therebetween; and a plurality of unit light sources mounted on the board, wherein each of the unit light sources comprises:

a wiring pattern formed on the board; and a light emitting device disposed on the wiring pattern to electrically connect thereto;

a non-conductive side wall surrounding, without interruption, the light emitting device at a predetermined interval therefrom, the non-conductive side wall being constructed of a plurality of coating layers and having a height lower than that of the light emitting device; and an encapsulant formed in a dome shape inside the side wall, wherein the side wall has an outer wall surface inclined toward an inner wall surface in such a way that the side wall has a width decreasing toward an apex.

5. The direct-type backlight unit according to claim 4, wherein the encapsulant comprises a transparent resin or a phosphor-mixed transparent resin.

6. The direct type backlight unit according to any one of claims 1, 2 and 4, wherein the wiring pattern in each of the unit light sources comprises:

upper terminals formed on the upper surface of the board where the light emitting device is disposed to be electrically connected to the light emitting device;

lower terminals formed on the lower surface of the board; and internal connectors extending through the board to connect the upper and lower terminals together.

7. The direct-type backlight unit according to any one of claims 1, 2 and 4, wherein the light emitting device is electrically connected to the wiring pattern by wire bonding.

8. The direct-type backlight unit according to any one of claims 1, 2 and 4, wherein the light emitting device is electrically connected to the wiring pattern by flip chip bonding.

9. The direct-type backlight unit according to any one of claims 1, 2 and 4, wherein the side wall has a width that is 1.5% to 3% of a diameter of the encapsulant.

10. The direct-type backlight unit according to any one of claims 1, 2 and 4, wherein the side wall has a height that is 1% to 1.5% of a diameter of the encapsulant.

11. The direct-type backlight unit according to any one of claims 1, 2 and 4, wherein the encapsulant has a height that is 25% to 35% of a diameter thereof.

12. The direct-type backlight unit according to claim 11, wherein the encapsulant has a height that is ⅓ of a diameter thereof.

13. The direct-type backlight unit according to any one of claims 1, 2 and 4, wherein each of the unit light sources comprises at least two of the light emitting devices mounted inside the side wall.

14. The direct-type backlight unit according to any one of claims 1, 2 and 4, wherein some of the encapsulants in the light sources comprise a transparent resin and the other encapsulants comprise a phosphor-mixed transparent resin, wherein the encapsulants comprising the transparent resin and the encapsulants comprising the phosphor-mixed transparent resin are mixed together.

15. The direct-type backlight unit according to any one of claims 1, 2 and 4, wherein the inside surface of the non-conductive side wall encircles and is in direct contact with an outside surface of the lower portion of the dome-shaped encapsulant.

* * * * *